(12) United States Patent
Brede et al.

(10) Patent No.: US 7,697,354 B2
(45) Date of Patent: Apr. 13, 2010

(54) INTEGRATED CIRCUIT MEMORY DEVICE RESPONSIVE TO WORD LINE/BIT LINE SHORT-CIRCUIT

(75) Inventors: Ruediger Brede, Hoehenkirchen (DE); Rainer Bartenschlager, Kaufbeuren (DE); Marcus Unertl, Trostberg (DE)

(73) Assignee: Qimonda AG, Munich (DE)

( * ) Notice: Subject to any disclaimer, the term of this patent is extended or adjusted under 35 U.S.C. 154(b) by 46 days.

(21) Appl. No.: 11/755,101

(22) Filed: May 30, 2007

(65) Prior Publication Data

US 2008/0298149 A1    Dec. 4, 2008

(51) Int. Cl.
*G11C 29/00* (2006.01)

(52) U.S. Cl. .................... 365/200; 365/203; 365/230.08

(58) Field of Classification Search .................. 365/200, 365/203, 230.06
See application file for complete search history.

(56) References Cited

U.S. PATENT DOCUMENTS

| 5,594,701 | A | * | 1/1997 | Asaka et al. ............ 365/230.03 |
|---|---|---|---|---|
| 6,049,492 | A | | 4/2000 | Vogelsang et al. |
| 6,333,882 | B1 | | 12/2001 | Merritt et al. |
| 6,930,622 | B2 | | 8/2005 | Brede et al. |
| 7,072,233 | B2 | | 7/2006 | Brede et al. |
| 7,161,867 | B2 | | 1/2007 | Kaku |
| 2003/0214851 | A1 | * | 11/2003 | Lin ............................. 365/200 |
| 2007/0008795 | A1 | * | 1/2007 | Tsukada ..................... 365/203 |

* cited by examiner

*Primary Examiner*—Huan Hoang
(74) *Attorney, Agent, or Firm*—Dicke, Billig & Czaja, PLLC

(57) ABSTRACT

An integrated circuit memory device includes a memory array with associated word lines and bit lines. A switching arrangement is connected between a word line and a first voltage source that selectively connects the word line to the first voltage source, and also is responsive to a short-circuit between the word line and the bit line.

22 Claims, 6 Drawing Sheets

INTEGRATED CIRCUIT MEMORY DEVICE RESPONSIVE TO WORD LINE/BIT LINE SHORT-CIRCUIT

BACKGROUND

Typically, a computer system includes a number of integrated circuit chips that communicate with one another to perform system applications. Often, the computer system includes a controller, such as a micro-processor, and one or more memory chips, such as random access memory (RAM) chips. The controller and memory communicate with one another to store data and to read the stored data.

The memory chips can be any suitable type of memory including RAM, which can be any suitable type of RAM, such as dynamic RAM (DRAM). DRAM typically includes a plurality of memory banks. Each memory bank includes one or more arrays of memory cells. The memory cells in each array of memory cells are arranged in rows and columns, with the rows extending along a row direction and the columns extending along a column direction. Conductive word lines and bit lines extend across the array of memory cells, with a memory cell located at each cross-point of a word line and a bit line or located at each second cross-point for example. Memory cells are accessed using a row address and a column address.

Each of the memory cells in an array of memory cells includes a capacitor and a transistor. The capacitor is electrically coupled through the transistor to one of the bit lines. The control input of the transistor is electrically coupled to one of the word lines. The transistor is switched on (conducting) to access the capacitor and off (non-conducting) to capture a voltage level on the capacitor via the appropriate word line. The capacitor is charged to a high voltage level that can represent a logic one or discharged to a low voltage level that can represent a logic zero.

During a precharge operation, a pair of bit lines are equalized to a common voltage level. In known memory systems, the bit line pair is coupled together and a precharge voltage is applied to the bit lines via one or more limit transistors, which among other things, limits the precharge current supplied by a voltage source during the equalization/precharge operation. Following the precharge operation during a BANKACTIVATE operation, one of the bit lines of the bit line pair receives a data bit value from a memory cell activated by the corresponding word line and the other bit line is used as a reference. To read the data bit, a sense amplifier amplifies the difference between the data bit value and the reference value and provides a sensed output value to an output driver. To write a data bit into a selected memory cell, input drivers overdrive the sense amplifier. One input driver overdrives a data bit value onto the bit line that is connected to the selected memory cell and another input driver overdrives the inverse of the data bit value onto the reference bit line.

Short-circuits can occur between word lines and bit lines in devices such as DRAMs. This is especially problematic in the precharge operations. To remedy this, the sense amplifier includes the limit transistors that function to limit current resulting from these short-circuits. The provision of the limit transistors, however, increases the size of the sense amplifier, and in turn, uses additional chip surface. Still further, the provision of such limit transistors may not adequately limit all of the undesirable short-circuit current in all situations.

For these and other reasons, there is a need for the present invention.

SUMMARY

In accordance with aspects of the present invention, an integrated circuit memory device includes a memory array with associated word lines and bit lines. A switching arrangement is connected between a word line and a first voltage source that selectively connects the word line to the first voltage source, and also is responsive to a short-circuit between the word line and the bit line.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustrating specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
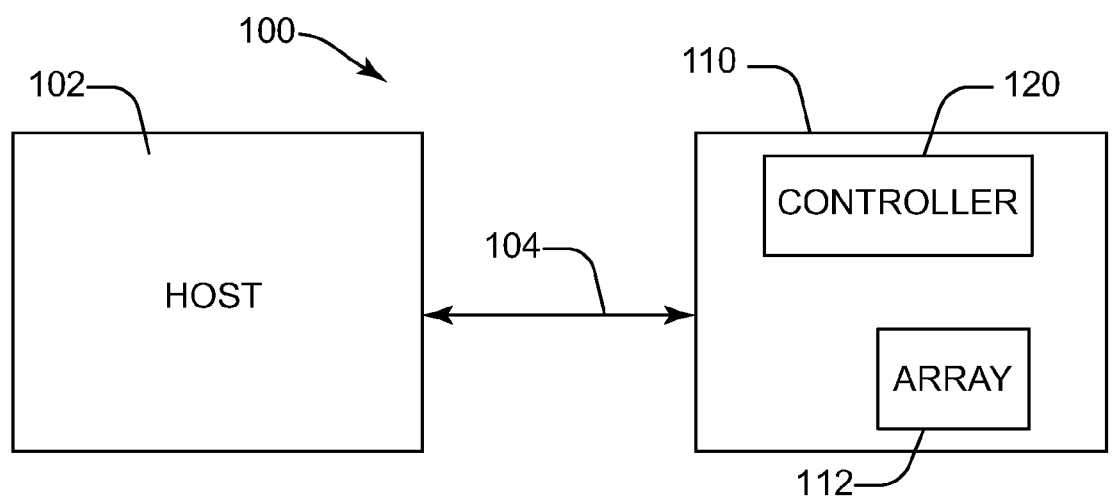
FIG. 1 is a block diagram illustrating an exemplary a memory system.

FIG. 1 is a block diagram illustrating an exemplary system 100. The memory system 100 includes a host 102 and a memory 110, which typically are implemented as integrated circuit chips. The memory 110 comprises a random access memory (RAM), such as a dynamic random access memory (DRAM). The host 102 is electrically coupled to the memory 110 through a memory communication path 104. The memory 110 includes a memory array 112 of memory cells and a controller 120 that controls detailed operations of memory 110 such as the various individual steps necessary for carrying out data writing, reading, and refresh operations.

The host 102 includes logic, firmware, and/or software for controlling the operation of the memory 110. In one embodiment, the host 102 is a microprocessor or other suitable device capable of passing a clock signal, address signals, command signals, and data signals to the memory 110 though the memory communication path 104 for reading data from and writing data to the memory 110. The controller 120 controls, among other things, communications with the host 102 through the memory communication path 104, and reading and writing data in the memory array 112. The memory 110 responds to memory read requests from the host 102 and passes the requested data to the host 102. The memory 110 responds to write requests from the host 102 and stores data in the memory array 112 passed from the host 102.

Figure 2:
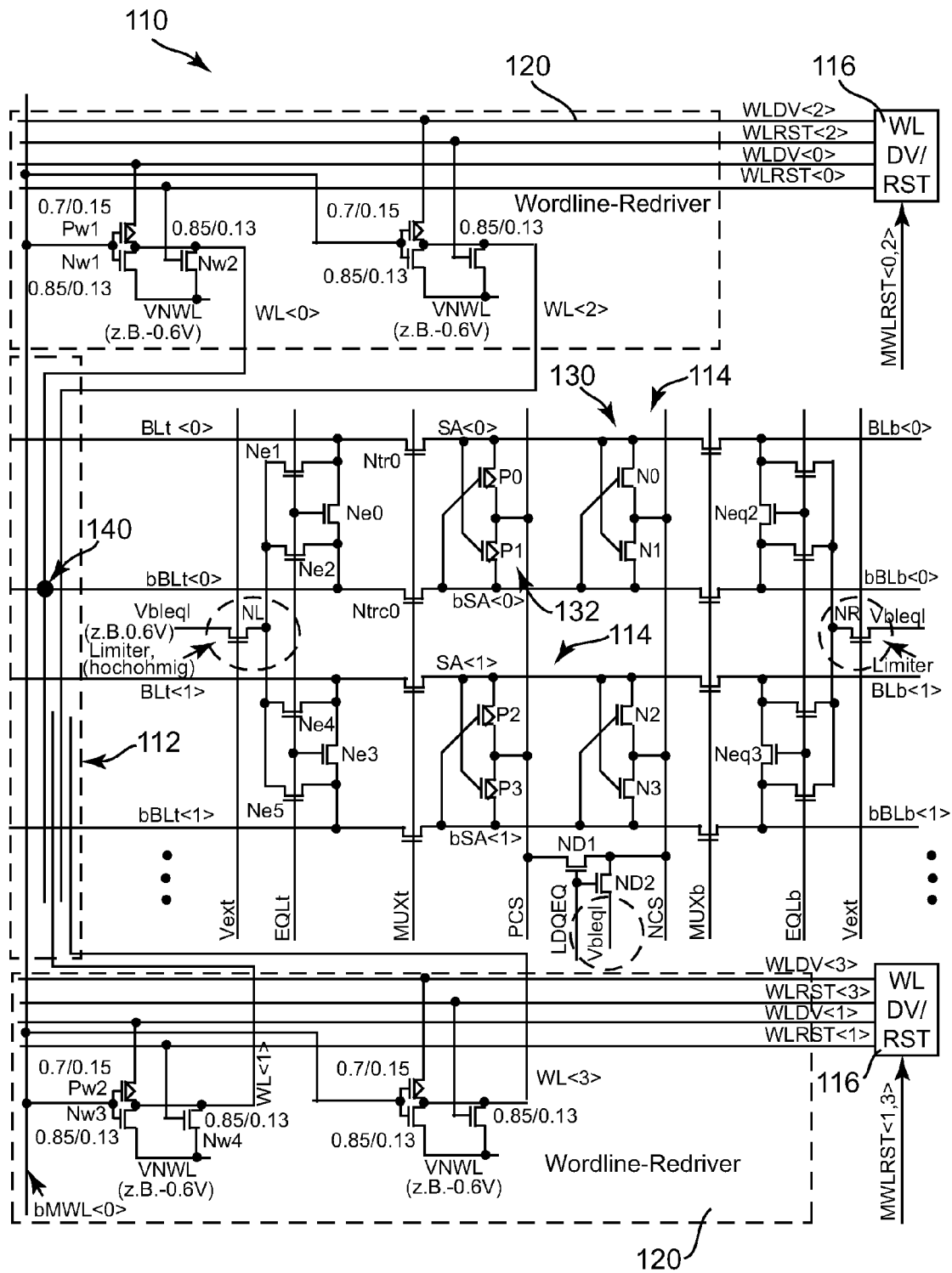
FIG. 2 is a schematic diagram illustrating portions of a typical DRAM.

FIG. 2 is a circuit diagram illustrating portions of a typical DRAM 110. The DRAM 100 includes an array of memory cells 112, first and second sense amplifiers 114, first and second circuits 116 for generating word line drive signals (WLDV) and word line restore signals (WLRST) and first and second word line redriver circuits 120. In the illustrated example, the array 112 is shown having four word lines (WL<0-3>) and four pairs of bit lines: BLt<0>, bBLt<0>; BLt<1>, bBLt<1>; BLb<0>, bBLb<0> and BLb<1>, bBLb<1>. The bit line pairs BLt<0>, *b*BLt<0> and BLb<0>, *b*BLb<0> are connected to the upper sense amplifier 114 and the bit line pairs BL*t*<1>, *b*BL*t*<1>and BLb<1>, *b*BLb<1> are connected to the lower sense amplifier 114.

The bit lines are each further connected to a plurality of dynamic memory cells (not shown) in the memory array 112. Each memory cell includes a capacitor (not shown) for storing a charge which indicates whether the cell is in a logic "1" or logic "0" state. The charge associated with a given memory cell may be coupled onto its corresponding bit line when addressed by a word line connected to the memory cell.

The circuits 116 for generating the WLDV and WLRST signals each receive master word line reset (MWLRST) signals corresponding to two word lines, with the upper circuit 116 receiving MWLRST<0,2> signals corresponding to word lines WL<0,2>, and the lower circuit 116 receiving MWLRST<1,3> signals corresponding to word lines WL<1, 3>. The circuits 116 output corresponding word WLDV and WLRST signals. The word line redriver circuits 120 receive master word line signals (bMWL) and output signals onto the proper word lines to activate the desired memory cells in the array 112.

For sake of simplicity, this disclosure focuses on the upper sense amplifier 114, which is discussed primarily in terms of the bit line pair BLt<0>, bBLt<0> connected to the left side of the sense amplifier 114 as illustrated. The bit line pair BLt<0>, bBLt<0> is connected to the sense amplifier 114 via isolation switches, or transistors Ntr0, Ntrc0, which have their gate terminals connected to a MUXt line. The MUXt signal controls the transistors Ntr0, Ntrc0 to selectively couple the bit line pair BLt<0>, bBLt<0> to the sense amplifier 114. The sense amplifier 114 includes an N-sense portion 130 (transistors N0,N1) and a P-sense portion 132 (transistors P0,P1). The N-sense portion 130 operates in response to an NCS signal and the P-sense portion 132 operates in response to a PCS signal, which cause the sense amplifier 114 to sense and amplify a potential difference between the bit line pairs.

The sense amplifier 114 includes a precharge arrangement of transistors Ne0, Ne1 and Ne2 connected between the bit line pair BLt<0>, bBLt<0>. An EQLt line is connected to the gates of the Ne0, Ne1 and Ne2 transistors, so that in response to the EQLt signal, the bit lines BLt<0>, bBLt<0> are shorted together and precharged to a common voltage level during a precharge operation. A leakage limiter transistor NL is controlled via a $V_{ext}$ signal to connect an equalization voltage $V_{bleq1}$ (0.6V in the illustrated example) to equalize and precharge the bit lines to the $V_{bleq1}$ level during the precharge operation.

Short-circuits can occur between word lines and bit lines, for example, between word line WL<0> and bit line bBLt<0> as shown at reference number 140 in FIG. 2. A current path is thus formed from the word line to the bit line, and then from the bit line through a corresponding precharge transistor, such as transistor Ne2, to the $V_{bleq1}$ source. The leakage limiter transistor NL adds resistance to limit the flow of leakage current resulting from such a short-circuit.

Figure 3:
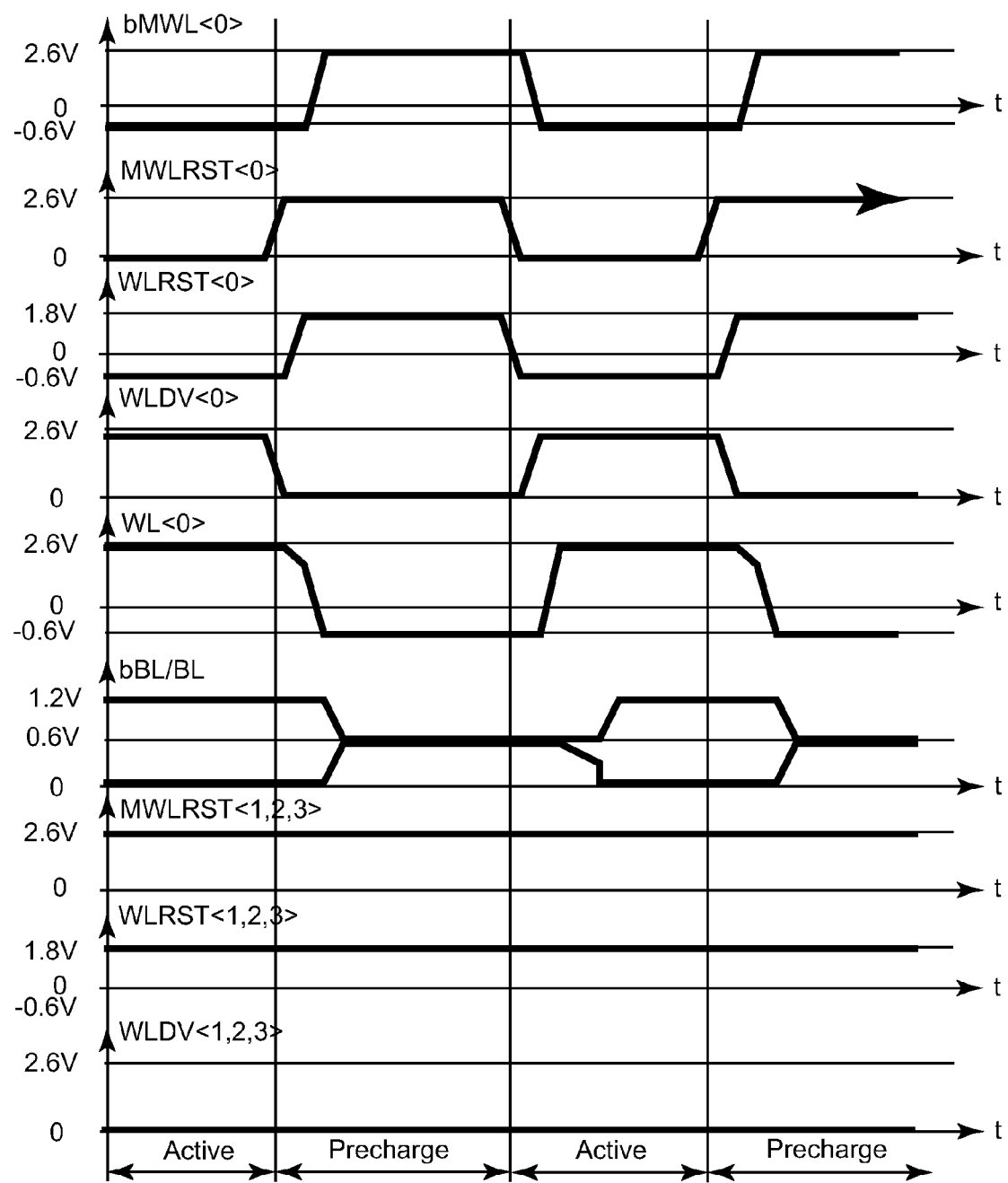
FIG. 3 is a timing diagram associated with the circuit illustrated in FIG. 2.

FIG. 3 is a timing diagram, illustrating certain signals of the circuit shown in FIG. 2. During precharge, the master word lines, such as the master word line bMWL<0>, are at the boosted word line voltage ($V_{PP}$) level (2.6V in the illustrated example), and the MWLRST lines are also at the $V_{PP}$ voltage. Upon a BANKACTIVATE command, the master word line bMWL<0> goes from the $V_{PP}$ voltage level to the negative word line ($V_{NWL}$) voltage (−0.6V in the illustrated example), and the appropriate one of the MWLRST lines, for example, MWLRST<0>goes to 0V. The word line reset (WLRST<0>) line also goes to the $V_{NWL}$ level and the WLDV<0> line goes to the $V_{PP}$ level. The word line WL<0> likewise goes to the $V_{PP}$ level.

The active word line WL<0> opens array transistors of the associated memory cells on the associated bit lines (the bit lines were equalized at the bit line equalization voltage $V_{bleq1}$ during precharge). The differential voltage between the bit line pair BLt<0>, bBLt<0> is amplified by the N-sense portion 130 (transistors N0, N1) and the P-sense portion 132 (transistors P0, P1), controlled by the NCS and PCS signals, respectively, resulting in one bit line going to the bit line high voltage level ($V_{BLH}$, 1.2V in the illustrated example), and the complementary bit line going to 0V.

A short time after the bit lines have been evaluated, the next precharge command can be issued, whereupon the MWLRST<0> line again goes to the $V_{PP}$ level. This results in the WLDV<0> line going to 0V and shortly thereafter, the WLRST<0> line going to logic high. The word line WL<0> goes from the $V_{PP}$ level to a somewhat reduced voltage of about 1.5V over the transistor Pw1 (WLDV is 0V) and then to the $V_{NWL}$ level over the transistor Nw2. As a result of this two-staged switching, the stress on transistor Nw2 is reduced. Subsequently, the master word line bMWL<0> goes from $V_{NWL}$ to $V_{PP}$, turning on the transistor Nw1, which is connected to transistor Nw2 in parallel. Thus, the transistor Nw1 is not required to bring the word line WL<0> from $V_{PP}$ to $V_{NWL}$; it serves only as a retaining transistor—it must be on if the WLRST<0> line is at the $V_{NWL}$ level and the master word line bMWL<0> is at the $V_{PP}$ level to hold word line WL<0> at $V_{NWL}$.

Following a precharge command issued for an active bank, the active word line goes to the low level ($V_{NWL}$). Whenever a word line is transitioning from the high level to the low level or from the low level to the high level, there will be a capacitive coupling between adjacent word lines (caused by parasitic capacitances between the word lines). The voltage of the adjacent word lines thus changes slightly ($V_{NWL}$+dU) due to the capacitive coupling of the switching word line. The larger the dU value, the larger the likelihood that the memory cells that are connected to that word line will lose their stored voltage. On the other hand, the dU value is minimized if the associated WLRST signal (for example WLRST<0>) is high when the adjacent word line (for example WL<1>) is switching because the word line (for example WL<0>) is strongly held at $V_{NWL}$ by the transistor Nw2.

After the master word line bMWL<0> is brought back to the $V_{PP}$ level, the bit line pairs are again equalized at the $V_{bleq1}$ level. If a word line/bit line short-circuit is present, such as the short-circuit 140 between word line WL<0> and bit line bBLt<0> shown in FIG. 2, current can flow from the $V_{NWL}$ source through transistors Nw1 and Nw2, over the word line/bit line short-circuit 140 and to the $V_{bleq1}$ source through transistors Ne2, Ne0 and Ne1 and the limit transistor NL, for example.

Figure 4:
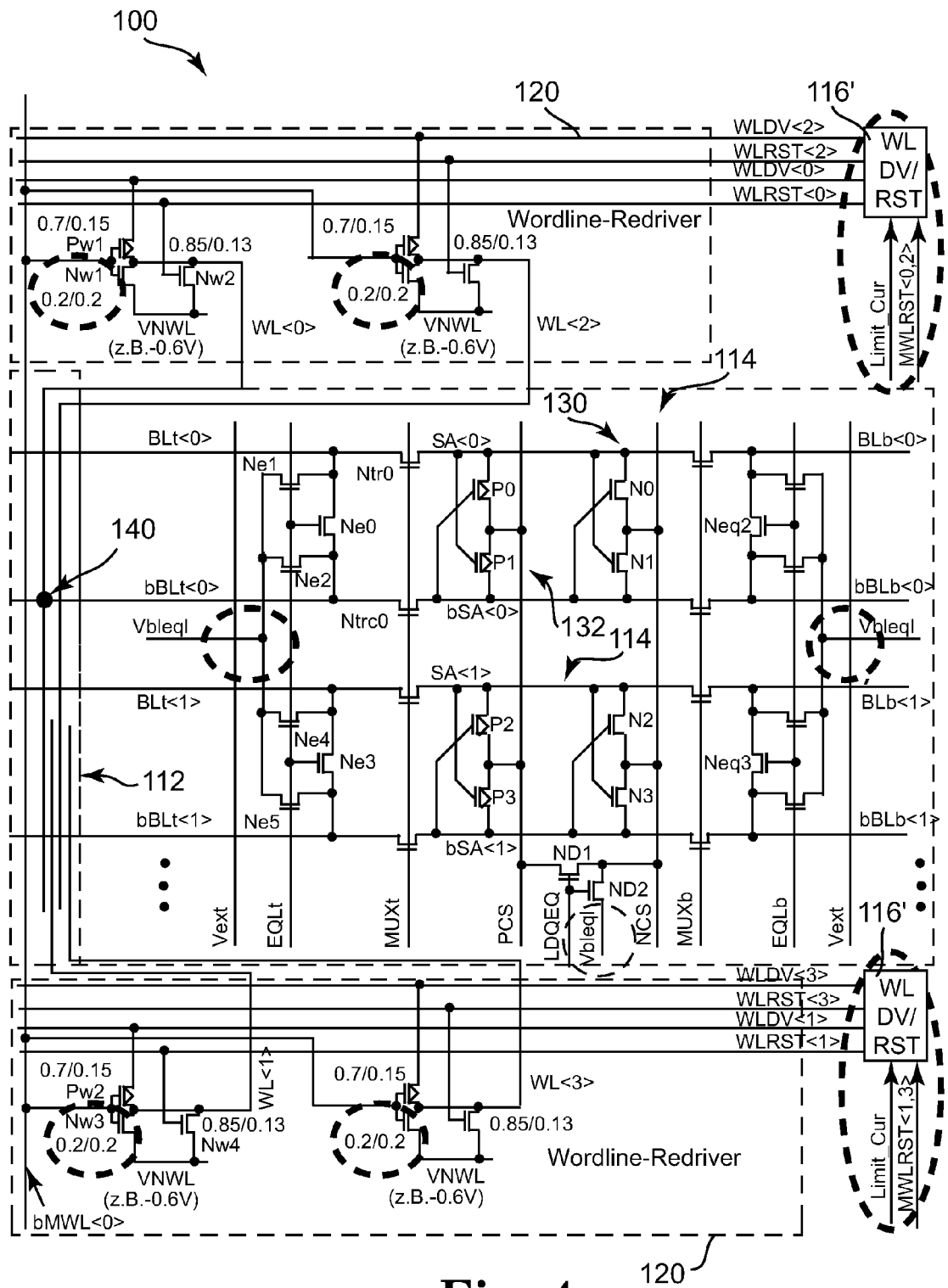
FIG. 4 is a schematic diagram illustrating portions of a DRAM in accordance with aspects of the present invention.

FIG. 4 is a circuit diagram illustrating portions of an exemplary DRAM embodying certain aspects of the present invention. The Nw1 transistor can manage the task of holding the word line at the $V_{NWL}$ level even if it is significantly more weakly dimensioned than in typical implementations such as that illustrated in FIG. 2. Typical width/length dimensions for the Nw1 transistor are 0.85 u/0.13 u as shown in FIG. 2, though a transistor dimensioned at about 0.2 u/02 u, as shown in FIG. 4, can fulfill this function, significantly reducing chip area used.

In the circuit of FIG. 4, the limit transistors NL, NR have been removed, which saves further chip area. The elimination of these transistors is facilitated by a modified circuit 116' for generating the word line drive and reset signals (WLDV, WLRST) disclosed herein. The circuit 116' receives a second input, Limit_Cur, in addition to the MWLRST inputs, and functions to limit current flow in the event of a word line/bit line short-circuit during precharge.

Figure 5:
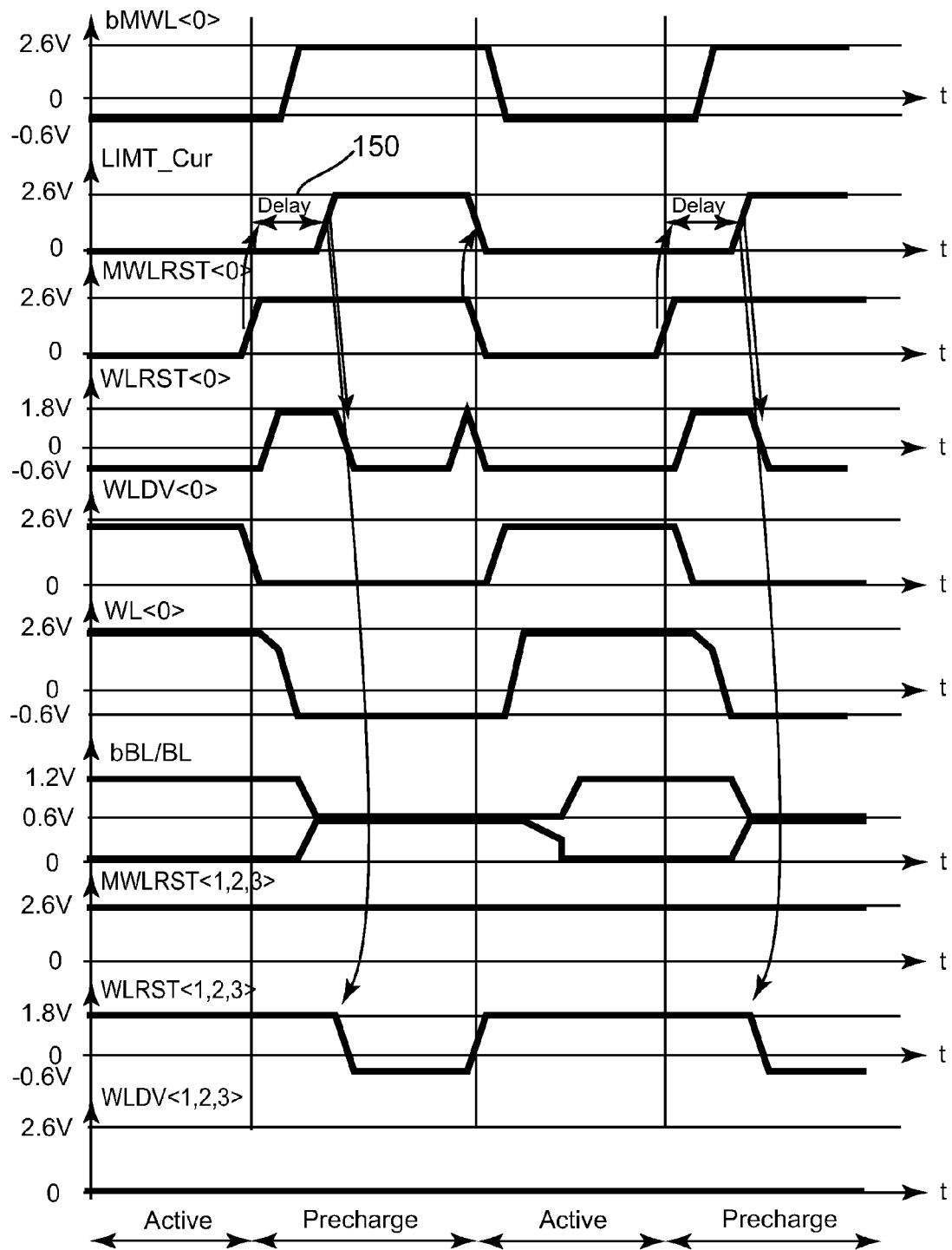
FIG. 5 is a timing diagram associated with the circuit illustrated in FIG. 4.

FIG. 5 is a timing diagram illustrating various signals associated with the circuit of FIG. 4. As shown in FIG. 5, the Limit_Cur signal goes to the $V_{PP}$ level during precharge after a predetermined delay 150. This switches off the WLRST signals during precharge, which turns off the Nw2 transistor. Thus, if a word line/bit line short-circuit is present during precharge, such as the short 140, $V_{NWL}$ current only flows through transistor Nw1 to the short 140, rather than through both transistors Nw1 and Nw2 connected in parallel. Moreover, the strength (width dimension divided by length dimension) of the transistor Nw1 can be significantly reduced. For example, in FIG. 2 the width/length of transistor Nw1 is 0.85 u/0.13 u=6.54. In contrast, in FIG. 4 transistor Nw1 is reduced to 0.2 u/0.2 u=1. The elimination of the limiter transistors NL and NR and the reduction in strength of transistor Nw1 (and the corresponding transistors in other areas of the circuit) results in a reduction in chip area used for the circuit and further results in reduction of the short-circuit-current.

Figure 6:
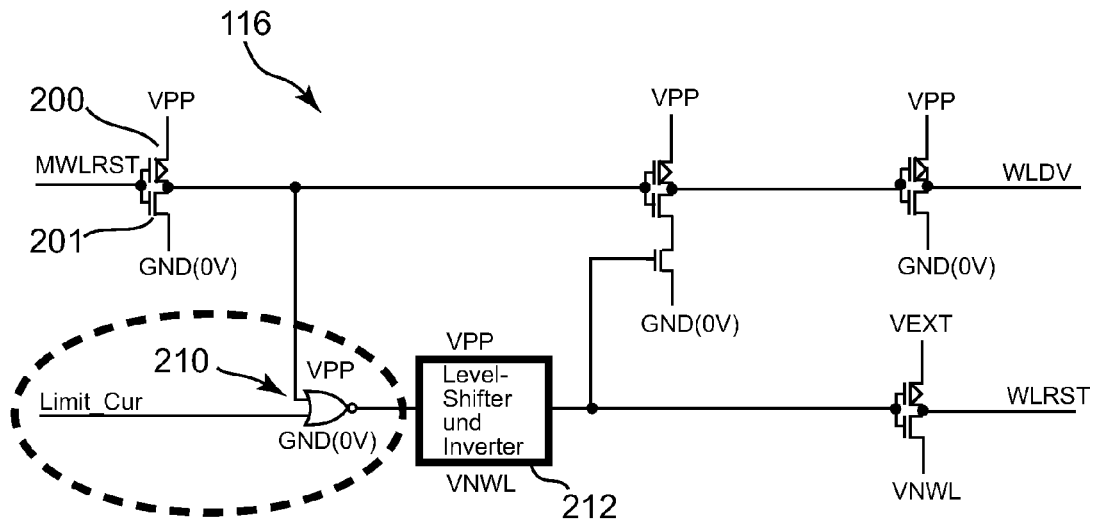
FIG. 6 is a schematic diagram illustrating an exemplary circuit for generating a word line drive signal WLDV and a word line restore signal WLRST in accordance with aspects of the present invention.

FIG. 6 is a circuit diagram illustrating an embodiment of the circuit 116'. The MWLRST signal is received by the gates of transistors 200, 201 to selectively couple the $V_{PP}$ signal or ground to a NOR gate 210, which also receives the Limit_Cur signal at another input terminal. The output of the NOR gate 210 is received by a level shifter and inverter 212, which outputs a control signal for controlling the WLRST output signal. The upper portion of the circuit 116' functions to output the WLDV signal.

As shown in FIG. 6 and the timing diagrams of FIGS. 3 and 5, the MWLRST signals go between $V_{PP}$ (2.6V) and 0 v. The WLRST signal, however, when at a logic low needs to be at the $V_{NWL}$ level (−0.6V) to insure that the transistor Nw2 is switched off. If the low level of WLRST were 0V rather than the $V_{NWL}$ level, then for example the voltage between the gate of Nw2 (0V) and the source of Nw2 (−0.6V) would be 0.6V and the transistor would be partially on. The low level of the word lines must be at the $V_{NWL}$ level to insure that the array transistors are switched off completely. Accordingly, when the Limit_Cur signal is 0, it does not affect the output of the circuit 116'—the WLDV and WLRST signals are output in response to the MWLRST input signal. The Limit_Cur signal is required in the event of a word line/bit line short-circuit during a precharge operation to limit current flow resulting from such a short by driving the WLRST output signal to $V_{NWL}$, thus turning off transistor Nw2.

Figure 7:
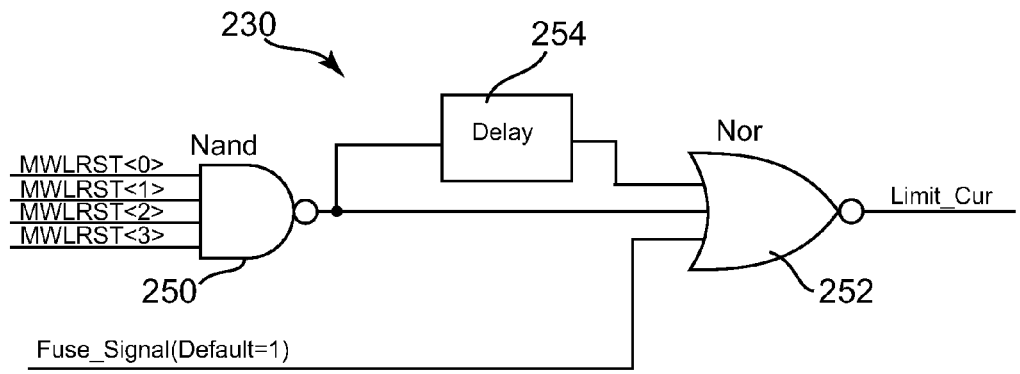
FIGS. 7 and 8 are schematic diagrams illustrating exemplary circuits for generating an input to the circuit of FIG. 6.
Figure 8:
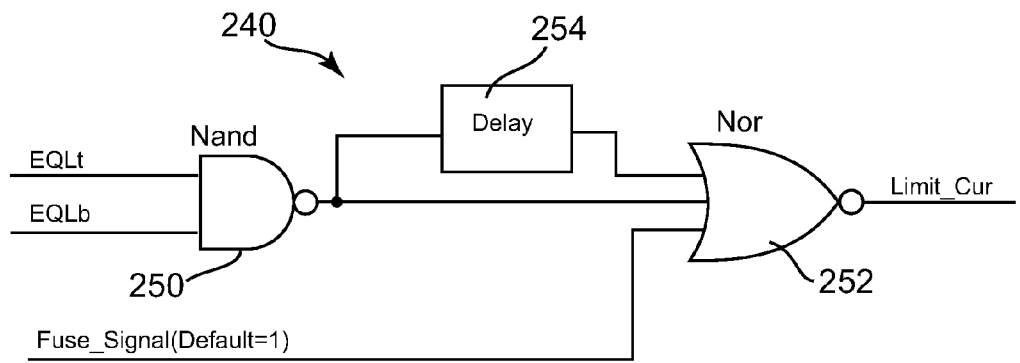

FIGS. 7 and 8 show two exemplary circuits 230 and 240, respectively, for generating the Limit_Cur signal. The circuits 230 and 240 each include a NAND gate 250 providing an output signal that is received by a NOR gate 252 both directly and via a delay 254. The NOR gate 252 also receives a Fuse_Signal that defaults to a logic high, but goes low in response to a word line/bit line short-circuit. As noted above, the Limit_Cur signal is only necessary during a precharge operation. Accordingly, the NAND gates 250 of circuits 230, 240 receive the MWLRST signals or EQLt/EQLb signals, respectively, which are all at a logic high level during precharge. In the event of a word line/bit line short-circuit during a precharge operation, the Limit_Cur signal is required to go high to turn off transistor Nw2.

As shown in the circuits 230, 240 the Limit_Cur signal goes to a logic high level during a precharge operation in response to the MWLRST<0,1,2,3> signals (One of the four MWLRST<0,1,2,3> signals is low during the active period and goes high after a precharge command is issued, see FIGS. 3 and 5), provided that the Fuse_Signal is low. The output of the NAND gate 250 goes low during precharge (all MWL-RST inputs are high), so if the Fuse_Signal is low, all inputs to the NOR gate 252 go low (after the delay of 254) and thus the output of the NOR gage 252, the Limit_Cur signal, goes high. The Fuse_Signal is a static signal. If the Fuse is blown by a laser (this is done when the chip is tested in response to a short-circuit between a word line and a bit line being measured), then the Fuse_Signal is static "0" and the Limit_Cur signal varies as shown in FIG. 5. If the fuse is not blown—no short-circuit between word line and bit line—then the Fuse_Signal is static "1" and the Limit_Cur signal is static "0" and has no influence on the circuits shown in FIGS. 6 and 7. Thus, some current can be saved with the Fuse_Signal as a result of not unnecessarily switching the Limit_Cur signal if there is no short-circuit between a word line and a bit line. The delay 254 provides the delay period 150 shown in FIG. 5 to allow the WLRST<0> signal to initially go to $V_{PP}$ during precharge to turn on transistor Nw2 and connect WL<0> to $V_{NWL}$ at the beginning of the precharge operation.

Semiconductor memory devices such as the exemplary embodiments disclosed herein typically employ some type of row redundancy scheme. Row redundancy involves replacing defective word lines, or rows of memory cells, with non-defective word lines. When a defective row is replaced, it is not physically replaced, but logically replaced. Thus, if a chip is tested and a short-circuit is measured between a bit line and a word line, the defective word line is replaced by a redundant word line. The short-circuit itself remains. Thus, the row redundancy can be used to generate the Fuse_Signal, rather than providing a fuse or fuse circuit. If the row redundancy scheme determines a short-circuit exists, the Fuse_Signal is set to static 0, and if no short-circuit is measures, the Fuse_Signal is set to a static 1, resulting in the Limit_Cur signal being a static 0.

Other embodiments are envisioned in which less than all of the WLRST lines are driven to $V_{NWL}$ in response to a word line/bit line short-circuit. For example, if the short-circuit 140 occurs involving WL<0> as shown in FIG. 3, only the WLRST<0,2> lines would be driven to $V_{NWL}$ in response to the short-circuit 140 occurring during precharge. In still further embodiments, a single WLRST line could go to $V_{NWL}$ in response to such an associated short-circuit.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
    a word line;
    a bit line;
    a first switching device connected between the word line and a first voltage source supplying a negative voltage, the first switching device having a gate terminal;
    a driver circuit outputting a control signal to the gate terminal of the first switching device in response to a short-circuit between the word line and the bit line.

2. The integrated circuit device of claim 1, wherein the driver circuit includes a first input configured to indicate the short-circuit between the word line and the bit line.

3. The integrated circuit device of claim 2, wherein the driver circuit includes a second input, wherein the control signal is output further in response to the second input.

4. The integrated circuit device of claim 3, wherein the driver circuit includes a delay circuit configured to delay the control signal output for a predetermined time period.

5. The integrated circuit device of claim 1, further comprising a second switching device connected between the word line and the first voltage source.

6. The integrated circuit device of claim 5, wherein the first and second switching devices are connected in parallel.

7. A memory device, comprising:
    an array of memory cells;
    a plurality of word lines;
    a plurality of bit lines;
    a first switching device connected between a selected one of the word lines and a first voltage source supplying a negative voltage, the first switching device having a gate terminal;
    a driver circuit outputting a control signal to the gate terminal of the first switching device in response to a short-circuit between the selected word line and one of the plurality of bit lines.

8. The memory device of claim 7, wherein the driver circuit includes a first input configured to indicate the short-circuit.

9. The memory device of claim 8, wherein the driver circuit includes a second input identifying the selected word line, wherein the control signal is output further in response to the second input.

10. The memory device of claim 9, wherein the driver circuit includes a delay circuit configured to delay the control signal output for a predetermined time period.

11. The memory device of claim 7, further comprising a second switching device connected between the word line and the first voltage source.

12. The memory device of claim 11, wherein the first and second switching devices are connected in parallel.

13. A memory device, comprising:
    an array of memory cells;
    a plurality of word lines;
    a plurality of bit lines;
    means for limiting current flow resulting from a short-circuit between the word line and bit line.

14. A method for operating a memory device, comprising:
    connecting a pair of bit lines to a first voltage source to precharge the pair of bit lines to a preselected voltage level;
    activating a first switch to connect a word line to a second voltage source that supplies a negative voltage;
    deactivating the first switch in response to a short-circuit between the word line and one of the bit lines.

15. The method of claim 14, further comprising activating a second switch connected in parallel with the first switch to connect the word line to the second voltage source.

16. The method of claim 15, wherein the second switch remains activated when the first switch is deactivated in response to the short-circuit.

17. The method of claim 14, wherein the first switch includes a gate terminal, the method further comprising outputting a control signal to the gate terminal in response to a first input signal indicating the short-circuit.

18. The method of claim 17, wherein the control signal is further responsive to a second input signal identifying the word line.

19. The method of claim 18, further comprising delaying the first input signal by a predetermined time period.

20. The method of claim 14, wherein a row redundancy scheme is used to determine the presence of a short-circuit.

21. An integrated circuit device, comprising:
    a word line;
    a bit line;
    a first switching device connected between the word line and a first voltage source, the first switching device having a gate terminal;
    a driver circuit outputting a control signal to the gate terminal of the first switching device in response to a short-circuit between the word line and the bit line, wherein the driver circuit includes:
        a first input configured to indicate the short-circuit between the word line and the bit line;
        a second input, wherein the control signal is output further in response to the second input; and
        a delay circuit configured to delay the control signal output for a predetermined time period.

22. The integrated circuit device of claim 21, wherein the first voltage source supplies a negative voltage.

* * * * *